United States Patent [19]
Iovdalsky et al.

[11] Patent Number: 6,057,593
[45] Date of Patent: May 2, 2000

[54] HYBRID HIGH-POWER MICROWAVE-FREQUENCY INTEGRATED CIRCUIT

[75] Inventors: Viktor Anatolievich Iovdalsky; Jury Isaevich Moldovanov, both of Fryazino, Russian Federation

[73] Assignee: Samsung Electronics Co., Ltd., Rep. of Korea

[21] Appl. No.: 09/091,081
[22] PCT Filed: Oct. 10, 1996
[86] PCT No.: PCT/RU96/00288
§ 371 Date: Aug. 3, 1999
§ 102(e) Date: Aug. 3, 1999
[87] PCT Pub. No.: WO98/15977
PCT Pub. Date: Apr. 16, 1998

[51] Int. Cl.$^7$ .................................................. H01L 23/552
[52] U.S. Cl. ..................... 257/659; 257/508; 257/699; 257/724; 257/783; 257/604
[58] Field of Search ..................... 257/723, 724, 257/659, 735, 500, 501, 506, 508, 604, 782, 783, 699

[56] References Cited

U.S. PATENT DOCUMENTS

| 3,431,468 | 3/1969 | Huffman . |
| 3,748,546 | 7/1973 | Allison . |
| 3,903,590 | 9/1975 | Yokogawa . |
| 4,907,062 | 3/1990 | Fukushima . |
| 5,151,769 | 9/1992 | Immorlica, Jr. et al. . |
| 5,315,486 | 5/1994 | Fillion et al. . |

*Primary Examiner*—Sheila V. Clark
*Attorney, Agent, or Firm*—Piper Marbury Rudnick & Wolfe

[57] ABSTRACT

In a power microwave hybrid integrated circuit, a depth of recesses (2) in a metal base (1) is selected so that a face surface of chips (3) and a metal base (1) are coplanar, a dielectric board (5) has a shield ground metallization (10) on its back side at the places adjoining the metal base (1), the metal base (1) is sealingly joined and electrically connected to the shield grounding metallization (10) of the board (5), and interconnecting holes (7) of the board (5) are filled with an electrically conducting material (9), the spacing between the side surfaces of the chips (3) and the side surfaces of the recesses (2) in the base (1) being of 0.001 to 0.2 mm.

3 Claims, 1 Drawing Sheet

HYBRID HIGH-POWER MICROWAVE-FREQUENCY INTEGRATED CIRCUIT

FIELD OF THE INVENTION

The present invention relates in general to electronic engineering and more specifically to a power microwave hybrid integrated circuit.

BACKGROUND OF THE INVENTION

One prior-art power microwave hybrid integrated circuit is known, the circuit comprises a metal base having through holes for naked semiconductor chips and an insulating polymer film joined to the metal base and having through holes mating with those of the base. A second insulating film is placed on and held to the first insulating film, said second film having through holes of a smaller size mating with the holes in the first polymer film. The naked semiconductor chips are mounted on the back side of the second polymer film with their bonding pads towards the films (i.e., upwards). A second commutation level is arranged on the face side of the second polymer film and is electrically connected to the chip bonding pads through the holes in the second polymer film (JP, B. 57-036746).

The integrated circuit discussed above is possessed of a low heat dissipation rate due to a small chip-to-metal base heat contact area.

One more prior-art power microwave hybrid integrated circuit is known, the circuit comprises a metal base having recesses, naked semiconductor chips disposed in and fixed to said recesses with a binder, a dielectric multilayer board having a topological metallization pattern on its face side and through holes electrically connecting the chip bonding pads to the topological metallization pattern of the board and filled with an electrically conducting material. The chips are slightly sunk into the metal base, and the planarization of the circuit is attained by applying, polymer dielectric layers of the board (cf. "Electronic devices on chip integral circuits", edited by I. N. Vozhenin, 1985, "Radio i Sviaz" Publishers, Moscow, p.261 (in Russian).

The circuit mentioned above is possessed of an inadequate heat conductance and low electrical characteristics.

SUMMARY OF THE INVENTION

The principal object of the present invention is to provide a power microwave hybrid integrated circuit having such a constructive arrangement that allows to improve electrical and heat dissipating characteristics thereof.

The foregoing object is accomplished due to the fact that in a power microwave hybrid integrated circuit, comprising a metal base having recesses, naked semiconductor chips disposed in and fixed to said recesses with a binder, a dielectric board having, a topological metallization pattern on its face side and holes electrically connecting the chip bonding pads to the topological metallization pattern of the board and filled with an electrically conducting material, according to the invention, the depth of the recesses in the metal base is selected so that the face surface of the chip and the metal base are coplanar, the dielectric board has a shield grounding metallization on the back side thereof at the places adjoining the metal base, the metal base is sealingly joined and electrically connected to the shield grounding metallization of the board, and the interconnecting holes are sealingly filled with an electrically conducting material, the spacing between the side surface of the chips and the side surfaces of the recesses in the base being of 0.001 to 0.2 mm.

The chip bonding pads to be grounded may be electrically connected directly to the shield grounding metallization of the board through beam leads 0.002 to 0.1 mm high.

The beam leads may be formed on the back side of the board.

Locating the chip face surface and the surface of the metal base complanar, providing the shield grounding metallization and sealingly electrical connection of the metal base to the shield grounding metallization, as well as filling, the interconnecting holes in the board with an electrically conducting material, ensures a hermetic sealing of the semiconductor chips.

Limiting the spacing between the chip side surface and the side faces of the recesses in the base from below is dictated by irregularities of the mating surfaces, while the upper limit thereof is dictated by conditions of heat dissipation from the chip.

Connecting the chip bonding pads to be grounded, directly to the shield grounding metallization ensures for the shortest possible grounding wire leads and hence their low spurious inductance.

The lower limit of the length of the beam leads is dictated by a minimum height required for electrical connection of the board to the chip bonding pads, while the upper limit thereof is dictated by the fact that a further increase in the length of the leads is a complicated task which is quite inexpedient.

BRIEF DESCRIPTION OF THE DRAWINGS

The present invention is illustrated by a detailed description of a specific exemplary embodiment thereof to be taken with reference to the accompanying drawings, wherein.

BEST METHOD OF CARRYING OUT THE INVENTION

Figure 1:
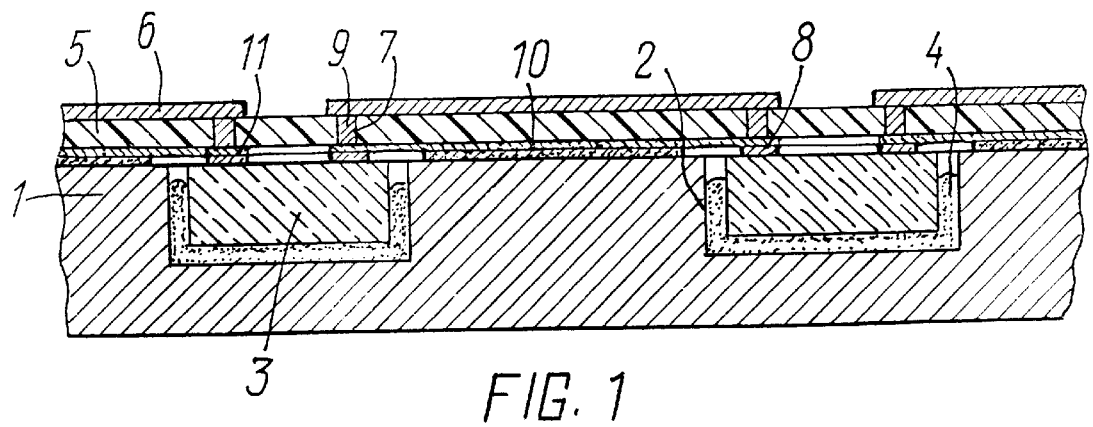
FIG. 1 is a sectional view of the filed power microwave hybrid integrated circuit.
Figure 2:
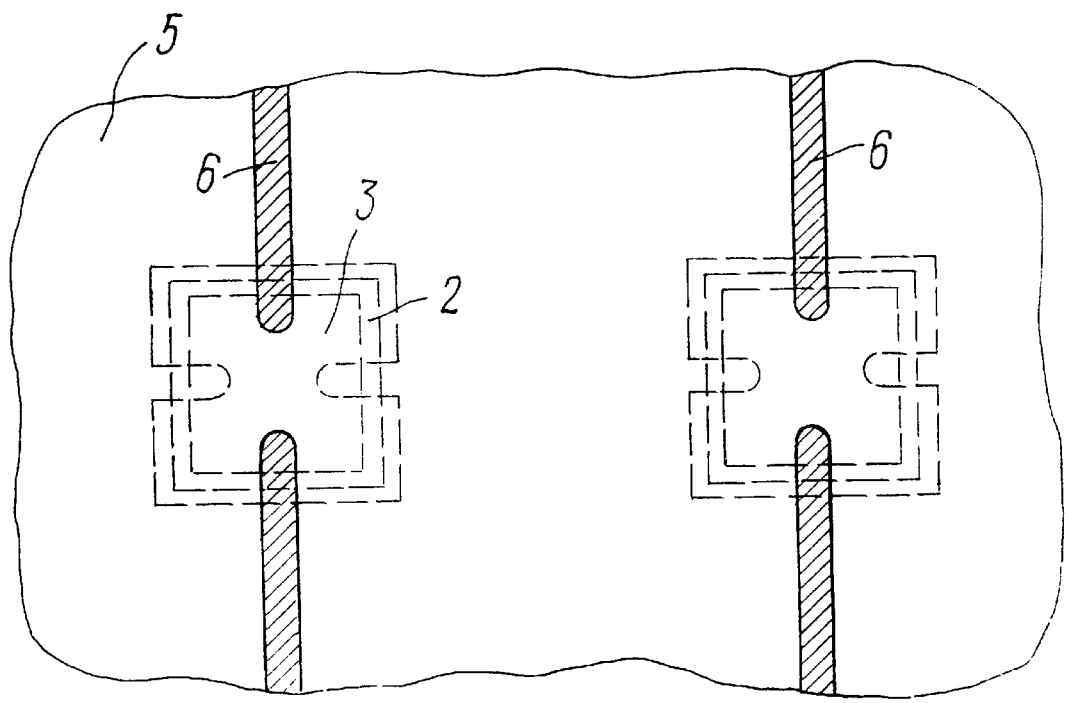
FIG. 2 is a plan view of FIG. 1.

The filed power microwave hybrid integrated circuit, according to the invention, comprises a metal base 1 (FIG. 1) having a recess 2 of, e.g., 0.60×0.55×0.35 mm. Naked semiconductor chips 3, such as transistor 3п603Б5 of 0.5× 0.45×0.3 mm, are placed in and fixed to the recesses 2 with a binder 4, e.g., the eutectic Au—Si hard solder. A dielectric board 5 made of, e.g., Polycor or sapphire being, e.g. 0.5 or 0.25 mm thick has a topological metallization pattern 6 (FIGS. 1 and 2) with, e.g., the following structure: Ti (0.002 $\mu$m)—Pd (0.2 $\mu$m)—Au (3 $\mu$m). Holes 7 (FIG. 1) in the board 5 having a diameter of, e.g., 100 mm interconnect bonding pads 8 of the chips 3 to a topological metallization pattern 6 of the board 5. The holes 7 in the board 5 are filled with an electrically conducting material 9, by, e.g., being grown sealingly with Pd—Ni (0.2 $\mu$m)—Cu (48 $\mu$m)—Ni (0.5 $\mu$m)—Au (3 $\mu$m) applied by the electroplating technique, or filled with a W—Cu pseudoalloy, followed by nickel—(0.5 $\mu$m) and gold (3 $\mu$m)-plating.

The bonding pads of 8 of the chips 3 to be grounded, e.g., transistor sources, are electrically connected directly to a shield grounding metallization 10 provided on the back side of the board 5. To provide electric contact of the bonding, pads 8 of the chips 3 to the material 9 filling the holes 7 or to the shield grounding metallization 10, 30 $\mu$m high beam leads 11 are made on the bonding pads 8 by the electrochemical deposition of Ni—Cu—Ni (0.5 $\mu$m)—Au (3 $\mu$m). The beam leads 11 may be made on the back side of the board 5.

The proposed depth of the recesses 2 in the metal base 1 ensures:

first, an increased area of contact of the chip 3 with the metal base 1 and the heat conducting binder 4, thus improving the heat dissipating characteristics of the circuit, according to the invention;

second, short electrical connections of the bonding pads 8 to be grounded, to the shield grounding metallization 10, thus reducing spurious inductance of the beam leads 11 and improving the electrical characteristics of the circuit, according to the invention.

The sealing and electrical connection of the shield Grounding metallization 10 of the board 5 to the metal base 1 ensures the hermetic sealing of the chip 3 and grounding of the shield grounding metallization 10 and through it, grounding of the bonding, pads 8 of the chip 3, as well as of other circuit components by the shortest route, thus reducing spurious inductance and improving the electrical characteristics of the circuit, according to the invention.

Providing electrical connections between the topological metallization pattern 6 of the board 5 and the bonding pads 8 of the chips 3 through the hole 7 sealingly filled with the electrically conducting material 9 ensures the protection of the chip 3 and simultaneously the short connection length, thus reducing spurious inductance.

The height of the beam leads 11 below 0.002 mm might result in preventing the shorting, of the metallization of the chip 3 through the metallization of the board 5 when the metallization of the chip 3 is not dielectrically passivated, while their height above 0.1 mm is inexpedient as involving larger dimensions and extra-consumption of materials.

The filed power microwave hybrid integrated circuit used as, e.g., a transistor amplifier, or a packaged semiconductor device, such as transistor, functions as follows.

A signal is applied to the input of the circuit and is then subjected to an appropriate conversion, whereupon the converted (e.g., amplified) signal is picked off the circuit output. Heat released during the operation of active semiconductor devices, such as transistors, is dissipated through the metal base 1, the board 5, and the beam leads 11.

Thus, the filed circuits ensures:

first, increasing, the area of contact with the base and hence improving the heat-dissipating, characteristics;

second, reducing the connection length of the grounding conductors and hence decreasing spurious inductance of the circuit, thereby improving the electrical characteristics thereof Additionally, the circuit is hermetically sealed, whereby it can be used without additional encapsulation, as, e.g., a packaged hybrid integrated circuit, or a packaged transistor.

In describing the disclosed embodiments of the present invention, specific narrow terminology is resorted to for the sake of clarity. However, the invention is not restricted to the specific terms so selected, and it should be understood that each such term covers all equivalent elements functioning in a similar way and used for solving similar problems.

Although the present invention has been described herein with reference to the preferred embodiment, it will be understood that various modifications and alterations may occur to the details of construction without departing from the spirit and scope of the invention, as will be readily understood by those skilled in the art.

All these modifications and alterations shouldl be considered to remain within the limits of the spirit and scope of the invention and the claims that follow.

Industrial Applicability

The present invention can be used in semiconductor microelectronics.

What is claimed is:

1. A power microwave hybrid integrated circuit, comprising a metal base (1) having recesses (2), naked semicinductor chips (3) disposed in and fixed to the recesses (2) with a binder (4), a dielectric board (5) having a topological metallization pattern (6) on its face side and holes(7) electrically connecting bonding pads (8) of the chips (3) to the topological metallization pattern (6) of the board (5) and filled with an electrically conducting material (9), CHARACTERIZED in that the depth of the recesses (2) in the metal base (1) is selected so that the face surface of the chip (3) and metal base (1) are coplanar, the dielectric board (5) has a shield grounding, metallization (10) on the back side thereof at the places adjoining the metal base (1), the metal base (1) is sealingly joined and electrically connected to the shield grounding metallization (10) of the board (5), and the interconnecting holes (7) are sealingly filled with an electrically conducting material (9), the spacing between the side surface of the chips (3) and the side surfaces of the recesses (2) in the metal base (1) being, of 0.001 to 0.2 mm.

2. The power microwave hybrid integrated circuit as set forth in claim 1, wherein the bonding pads (8) of the chips (3) to be grounded are electrically connected directly to the shield grounding metallization (10) of the board (5) through beam leads (11) 0.002 to 0.1 mm high provided on the bonding pads (8) of the chips (3).

3. The power microwave hybrid integrated circuit as set forth in claim 1 wherein the beam leads (11) are located on the back side of the board (5).

* * * * *